United States Patent [19]
Lin et al.

[11] Patent Number: 5,620,909
[45] Date of Patent: Apr. 15, 1997

[54] METHOD OF DEPOSITING THIN PASSIVATING FILM ON MICROMINIATURE SEMICONDUCTOR DEVICES

[75] Inventors: Jenshan Lin, Flanders, N.J.; James R. Lothian, Bethlehem, Pa.; Fan Ren, Warren, N.J.

[73] Assignee: Lucent Technologies Inc., Murray Hill, N.J.

[21] Appl. No.: 566,766

[22] Filed: Dec. 4, 1995

[51] Int. Cl.⁶ .......................... H01L 21/338; H01L 21/50; H01L 29/812

[52] U.S. Cl. .......................... 438/703; 438/951; 438/570; 438/958

[58] Field of Search .................. 437/235, 238, 437/241, 912, 39, 40, 41, 184, 176, 177, 944, 659.11

[56] References Cited

U.S. PATENT DOCUMENTS

| | | | |
|---|---|---|---|
| 4,564,997 | 1/1986 | Matsuo et al. | 29/576 W |
| 4,566,940 | 1/1986 | Itsumi et al. | 156/643 |
| 4,859,618 | 8/1989 | Shikata et al. | 437/41 |
| 4,977,100 | 12/1990 | Shimura | 437/44 |
| 5,053,348 | 10/1991 | Mishra et al. | 437/41 |
| 5,170,228 | 12/1992 | Sasaki | 257/184 |
| 5,237,192 | 8/1993 | Shimura | 257/280 |
| 5,500,381 | 3/1996 | Yoshida et al. | 437/41 |

FOREIGN PATENT DOCUMENTS

| | | | |
|---|---|---|---|
| 2180031 | 7/1990 | Japan | 437/912 |
| 2189936 | 7/1990 | Japan | 437/912 |

OTHER PUBLICATIONS

Wolf, Stanley "Silicon Processing for the VLSI ERA", vol. 2, pp. 235–238, 259–260 (1990).

M.J. Hernandez et al, "Kinetics & Compositional Dependence on the Microwave Power & SiH4/N2 Flow Ratio of Silicon Nitride Deposited by Electron Cyclotron Resonance Plasmas", Nov. 1994, pp. 3234–3237, J. Electrochem. Soc., vol. 141, No. 11.

Primary Examiner—Robert M. Kunemund
Assistant Examiner—Matthew Whipple

[57] ABSTRACT

A thin conformal passivating dielectric film is deposited by ECR-CVD on an IC chip comprising semiconductor devices each of which includes a sub-micron-width irregularly shaped gate electrode. A protective layer of patterned resist is formed overlying each passivated device. Additional dielectric material is then deposited by ECP-CVD, at a temperature below the glass transition temperature of the resist, on the surface of the chip. Subsequently, in a lift-off step, the patterned resist together with the additional dielectric material overlying the resist is removed from the chip.

5 Claims, 3 Drawing Sheets

METHOD OF DEPOSITING THIN PASSIVATING FILM ON MICROMINIATURE SEMICONDUCTOR DEVICES

BACKGROUND OF THE INVENTION

This invention relates to the fabrication of semiconductor devices and, more particularly, to a method for depositing a thin passivating film on sub-micron-size semiconductor devices included on an integrated-circuit (IC) chip.

Plasma-enhanced chemical-vapor-deposition (PECVD) processes are widely employed in the fabrication of semiconductor devices. Such processes can produce amorphous dielectric films at relatively low temperatures (about 300 degrees Celsius) with close control of composition. For a detailed description of typical PECVD processes, see, for example, *Silicon Processing for the VLSI Era*, Vol. 1, "Processing Technology", Luttice Press, Calif. (1986).

Deposition of a conformal passivating dielectric film is a required step in the fabrication of a variety of semiconductor devices of practical importance. Thus, for example, silicon nitride passivation of III-V compound high-electron-mobility transistors (HEMTs) is typically employed to ensure stable long-term performance of such transistors.

The high-frequency operation of an HEMT device is a function of the thickness of the dielectric deposited on its gate electrode. As this thickness increases, the high-frequency performance of the transistor device is degraded due to an increase in gate capacitance.

In a conventional PECVD process carried out at about 300 degrees Celsius, the thickness of the dielectric on the gate electrode is typically not determined solely by the thickness of the film deposited during the gate passivation step. The final dielectric thickness thereon is also determined by the additional thickness of dielectric material deposited in other PECVD steps of the fabrication sequence. Thus, for example, when dielectric material is deposited to form capacitors on the IC chip, this additional material adds to the thickness of the passivating film to produce a dielectric on the gate electrode that is thicker than that desired for optimal high-frequency performance.

In an HEMT device designed to operate at very high frequencies, the gate electrode of the device may have a width in the sub-micron range [for example, in the range of only about 0.1 micrometers (μm) to one μm]. To reduce the resistivity of such a small gate electrode, and thereby preserve its high-frequency performance, the electrode is typically formed to have, for example, a mushroom-type shape. But, in practice, the task of achieving complete conformal coverage of the entirety of the surface of such an irregularly shaped gate electrode with a PECVD-deposited passivating film has been found to be extremely difficult, if not impossible. And, without such complete passivation, the uncovered portions of the gate electrode may, for example, be subsequently eroded or oxidized, thereby to deleteriously affect the performance of the final device.

Accordingly, efforts have continued by workers skilled in the art directed at trying to devise other ways of depositing a thin conformal passivating film on sub-micron-size semiconductor devices. It was recognized that such efforts, if successful, could improve the performance and reliability of devices designed to operate at very high frequencies.

SUMMARY OF THE INVENTION

In accordance with the principles of the present invention, a high-ion-density source based on the principle of Electron Cyclotron Resonance (ECR) is utilized in a CVD process to conformally deposit a thin passivating dielectric film on a semiconductor device included on an IC chip. Importantly, the ECR-CVD process is carried out at a temperature that is below the glass transition temperature (typically, less than about 130 degrees Celsius) of resist material employed in the process. As a result, resist material can be used to mask the device, including its passivating film, while additional dielectric is deposited on the IC chip by the ECR-CVD process. Subsequently, the resist and the additional dielectric material overlying the resist can be removed in a conventional lift-off step.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

The principles of the present invention are applicable to the fabrication of a variety of known semiconductor devices. Herein, for purposes of a specific illustrative example, emphasis will be directed to making a high-frequency version of the particular structure represented in FIG. 1.

Figure 1:
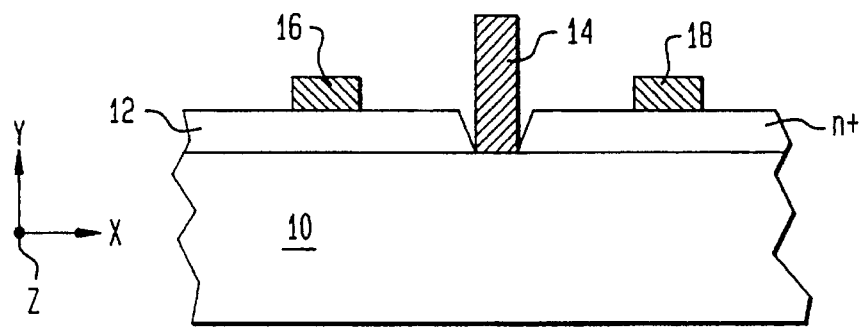
FIG. 1 is a simplified schematic representation of a conventional low-frequency semiconductor device included on an IC chip.

FIG. 1 schematically depicts a portion of an IC chip. In particular, FIG. 1 represents a conventional HEMT device included on such a chip. Such an HEMT device includes a substrate comprising a III-V compound semiconductor. The device further includes layers of III-V materials overlying the substrate, as is well known in the art. In FIG. 1, the noted substrate and overlying layers are collectively designated by the reference numeral 10.

The known HEMT device of FIG. 1 also includes a layer 12 made of a III-V material such as InGaAs. Illustratively, the thickness or Y-direction extent of the layer 12 is about 0.05-to-0.1 μm. By standard techniques, an opening is made in the layer 12 and a conventional gate electrode 14 is then formed on the top surface of the structure 10. By way of example, the gate electrode 14 is made of three layers comprising, from bottom to top, successive layers of titanium (Ti), platinum (Pt) and gold (Au). Such a three-layer electrode structure is standard in the art.

The FIG. 1 device also includes ohmic contacts 16 and 18 made, for example, of a conventional Au/germanium alloy. The contacts 16 and 18 serve as the respective source and drain contacts of the depicted transistor device.

In cases in which the width or X-direction extent of the interface between the gate electrode 14 and the top surface of the structure 10 of FIG. 1 is greater than about one μm, a gate electrode having a rectangular profile as shown in FIG. 1 can have a sufficiently low resistivity to achieve good high-frequency performance of the device. But to operate an HEMT device at still higher frequencies (say, above about two gigahertz), a sub-micron-width gate electrode is typically required. For such higher-frequency operation, however, a transistor device design having a rectangular-profile sub-micron-width gate electrode usually exhibits too much resistivity to be able to ensure the desired higher-frequency operation. In those cases, a gate electrode profile of the general type shown in FIG. 2 is often resorted to to achieve the requisite lower resistivity.

Figure 2:
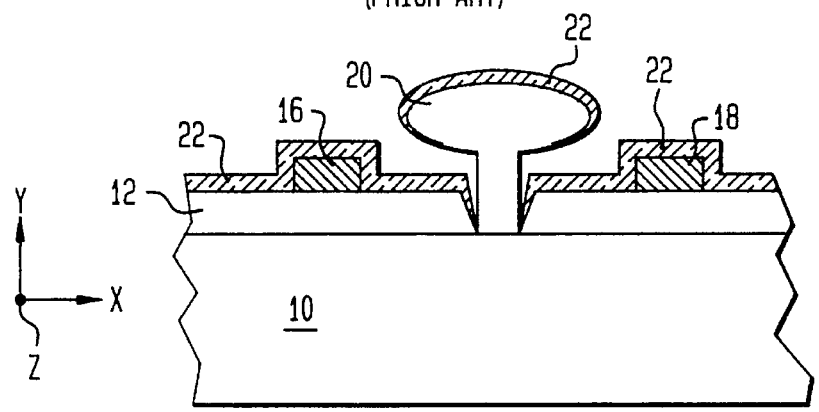
FIG. 2, which is a simplified schematic depiction of a known high-frequency version of the FIG. 1 device, illustrates the failure of a PECVD-deposited passivating film to cover a critical portion of the device.

The structure 10 and the layer 12 of the known device shown in FIG. 2 are, for example, approximately the same as the correspondingly numbered elements in FIG. 1. The only difference between them is that the width of the opening in the layer 12 of FIG. 2 is less than the width of the opening in the layer 12 of FIG. 1. In turn, a gate electrode 20 suitable for very-high-speed transistor operation above about two gigahertz is formed on the top surface of the structure 10 of FIG. 2. Source and drain electrodes 16 and 18 are also shown in FIG. 2.

Illustratively, the width of the gate electrode 20 (FIG. 2) at its interface with the surface of the structure 10 is in the sub-micron range (for example, in the range of about 0.1- to-1.0 μm). To ensure that such a narrow gate electrode exhibits a sufficiently low resistivity to achieve the desired high-frequency operation, it is common practice to form the electrode with a broadened upper portion. Thus, for example, as shown in FIG. 2, a generally mushroom-shaped gate electrode 20 having a narrow sub-micron-width stem portion and an enlarged or bulbous upper portion constitutes an effective design for achieving a low-resistivity gate electrode suitable for very-high-speed transistor operation. An electrode of this design can be made, for example, by known electron-beam direct-writing techniques utilizing multiple-layer resists.

In practice, a passivating film must be deposited on the very-high-frequency HEMT device represented in FIG. 2. Covering the entire surface area of such a device, particularly the small irregularly shaped gate electrode, poses a considerable challenge. And, in fact, attempts to passivate the electrode 20 of FIG. 2 by conventional PECVD processes have resulted in only partial coverage of the surface of the electrode.

More specifically, FIG. 2 shows a passivating dielectric film 22 made, for example, of silicon nitride deposited on the depicted device in a conventional PECVD step. The film 22 has a thickness of, for example, approximately 0.08 μm. As indicated, the passivating film 22 does not conformally cover the entirety of the surface of the gate electrode 20. In particular, the film 22 is illustrated as failing to cover the stem portion and underparts of the bulbous portion of the mushroom-shaped gate electrode 20.

Additionally, deposition of the passivating film 22 of FIG. 2 in a conventional PECVD step is typically carried out at a temperature (for example, at about 300 degrees Celsius) that exceeds the glass transition temperature (typically, less than about 130 degrees Celsius) of commonly used resist materials. It is not therefore feasible to mask the HEMT device including the gate electrode 20 with a conventional resist material during subsequent PECVD processing steps in which additional relatively thick layers of dielectric material are deposited on other portions of the depicted IC chip. As a result, the final thickness of dielectric material overlying the HEMT device would unavoidably exceed the thickness of the originally deposited film 22. Thus, even if complete conformal coverage of the gate electrode 20 could be achieved in a PECVD process, it is generally not possible to thereby achieve a sufficiently thin final dielectric thickness overlying the device to ensure very-high-speed operation thereof.

In accordance with the principles of the present invention, a thin conformal passivating dielectric film is deposited in an ECR-CVD system on a device that includes a sub-micron-size gate electrode. Illustratively, the gate electrode is shaped in the form of a mushroom. Additional dielectric layers required on other parts of an IC chip are also deposited by ECR-CVD. And, since ECR-CVD process steps can be carried out at a relatively low temperature (for example, at a temperature in the range of room temperature-to-about 100 degrees Celsius), any of a wide variety of known photoresist, electron-beam resist or X-ray resist materials having glass transition temperatures below about 130 degrees Celsius can be utilized to mask the device during deposition of additional dielectric material. Such a resist material can be subsequently removed in a standard lift-off process. In that way, thin conformal passivating films suitable for reliable very-high-speed device operation are consistently realized.

Figure 3:
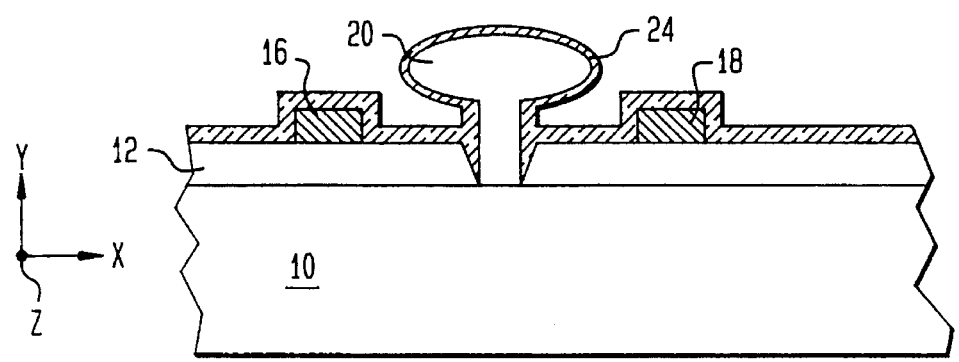
FIG. 3 shows a thin conformal passivating film deposited on a high-frequency version of FIG. 1 by ECR-CVD in accordance with the principles of the present invention.

Various elements of the partial IC structure represented in FIG. 3 are identical to those shown in FIG. 2 and are thus designated with the same respective reference numerals. In addition, FIG. 3 shows a thin conformal passivating film 24 made, for example, of a suitable dielectric material such as silicon nitride, $SiN_x$, where x has a value between about 1.2 and 1.4. Such films made of $SiN_x$, or a dielectric film made, for example, of silicon, silicon dioxide, silicon oxyfluoride or silicon oxynitride, are widely used in the semiconductor art for passivation purposes.

In accordance with the invention, the $SiN_x$ film 24 shown in FIG. 3 is deposited on the entire top surface of the IC chip in an ECR-CVD step. By way of example, in a specific illustrative HEMT device designed for very-high-speed operation, the thickness of the passivating film 24 is only about 80 nanometers (nm). Note that the entirety of the surface of the stem and of the underpans of the gate electrode 20 of FIG. 3, unlike the corresponding parts in FIG. 2, are covered with the thin passivating film 24.

As noted earlier, ECR-CVD is a deposition process characterized by low temperature relative to conventional PECVD processes. Also, ECR-CVD is characterized by an advantageous ion density that is typically several orders of magnitude greater than PECVD, while exhibiting much lower electron and ion energies than PECVD. Further, ECR-CVD is a low-pressure process relative to PECVD and is characterized by an ion mean-free-path that is at least two orders of magnitude greater than PECVD. As a result of these properties, thin dielectric films deposited by ECR -CVD have been found to be consistently conformal even over irregularly shaped elements, while causing minimal damage to underlying surfaces.

By way of example, the ECR-CVD process utilized to deposit the passivating film 24 on the entirety of the top surface of the structure depicted in FIG. 3 is carried out at a pressure in the range of approximately one-to-two milli-Torr and, importantly, as noted earlier above, at a temperature in the range of room temperature-to-about 100 degrees Celsius. Illustratively, the device to be coated is placed on a quartz carrier that is clamped to the cathode of a conventional ECR-CVD reaction chamber. Ion energies can be controlled by superimposing a 13.56 megahertz bias on the device. A standard ECR source is, for example, operated at 2.45 gigahertz, with the microwave power set at about 100-to 1000 Watts. Under these particular illustrative conditions, utilizing nitrogen and silane diluted in nitrogen, helium or argon as the constituent gases, $SiN_x$ is deposited at a rate of about 4-to-8 nm per minute.

Figure 4:
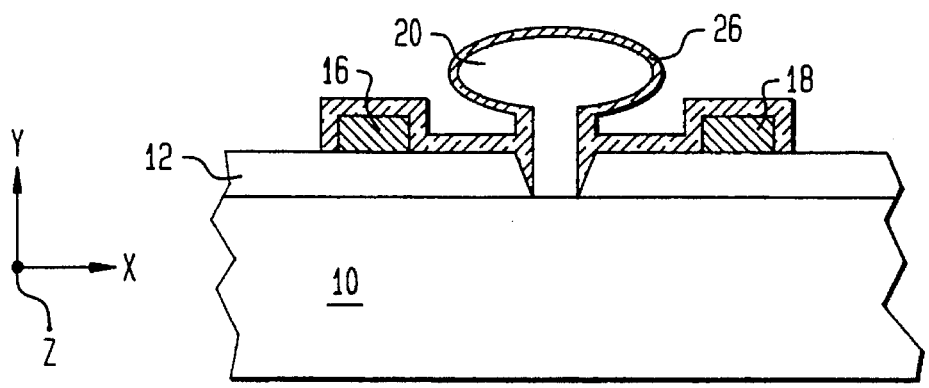
FIGS. 4 through 7 schematically represent subsequent steps carried out on the FIG. 3 structure in accordance with the invention.

Subsequent to the aforementioned ECR-CVD step, the passivating film 24 of FIG. 3 is patterned by conventional techniques. In particular, the film 24 is etched to remove portions thereof that do not cover active devices. As a result, as illustratively shown in FIG. 4, the portion of the film 24 of FIG. 3 that remains after etching conformally covers the HEMT device including the electrodes 16, 18 and 20. In FIG. 4, this remaining portion of the passivating film 24 is designated with the reference numeral 26.

Figure 5:
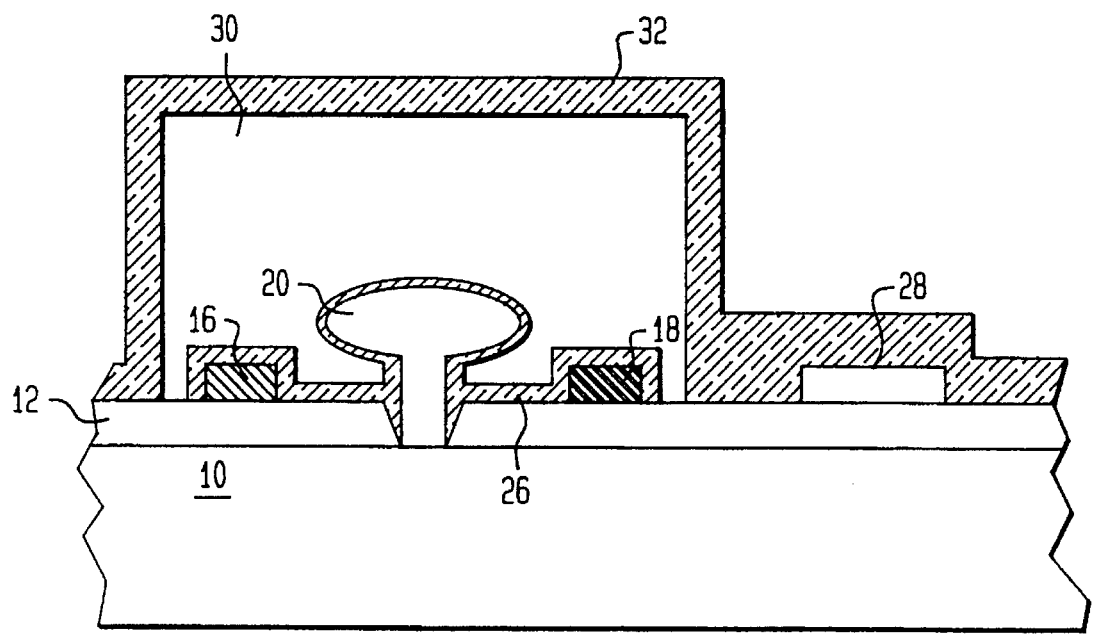

Assume, for illustrative purposes, that a conventional capacitor is also to be fabricated on the layer 12 of the partial IC chip represented in FIG. 4. For that purpose, a standard metallization structure is formed, in a manner well known in the art. The metallization structure is shown in FIG. 5, where it is designated by reference numeral 28. This portion 28 constitutes one plate of the noted capacitor. Illustratively, the Y-direction thickness of the plate 28 is about one μm. And, for example, the plate 28 comprises a conventional three-layer structure including, from bottom to top, successive layers of Ti, Pt and Au.

Next, in accordance with the invention, and before the dielectric of the noted capacitor is formed, a layer of a standard resist material having a glass transition temperature below about 130 degrees Celsius is formed in conventional ways overlying active devices on the IC chip. Thus, for example, resist portion 30 shown in FIG. 5 overlies and completely encompasses the HEMT device that includes the electrodes 16, 18 and 20.

Subsequently, a blanket layer 32 of a standard dielectric material is deposited on the top surface of the FIG. 5 structure. Portions of this material will constitute the dielectric layers of capacitors being formed on the depicted IC chip. The thickness of the layer 32 is, for example, about 150 nm.

Importantly, in accordance with the invention, this additional relatively thick dielectric layer 32 is deposited in an ECR-CVD step of the type described earlier above. Since this deposition step is carried out at a relatively low temperature, below the glass transition temperature of the resist portion 30, the protective resist portions overlying active devices remain intact during deposition. As a result, the additional dielectric layer 32 remains separated from and does not add to the thickness of the previously formed thin passivating layer 26 that overlies the depicted active device.

Figure 6:
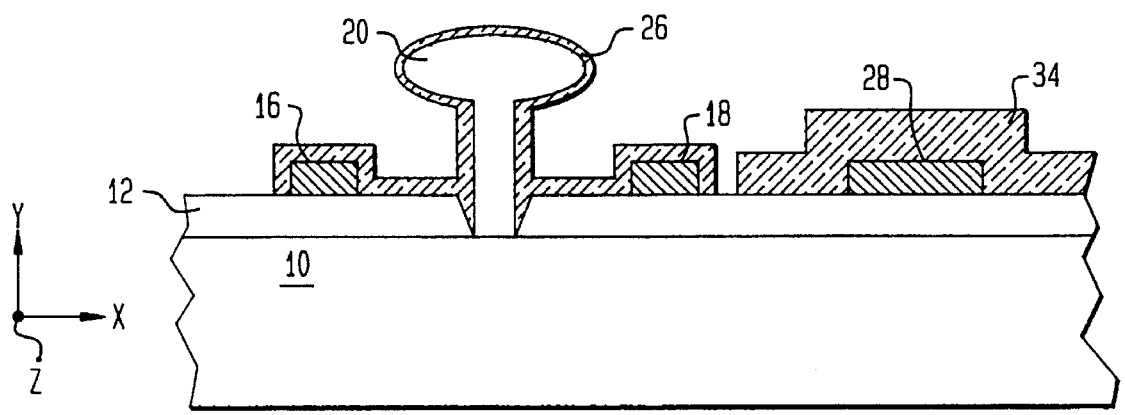

Next, utilizing, for example, a solvent such as acetone, the resist portion 30 (FIG. 5) and the portions of the dielectric layer 32 overlying the portion 30 are removed from the structure in a conventional lift-off step. The portion of the dielectric layer 32 that remains after lift-off is shown in FIG. 6 where it is designated by reference numeral 34. As indicated earlier, this remaining portion 34 constitutes the dielectric of the capacitor that includes the aforementioned conductive plate 28.

Figure 7:
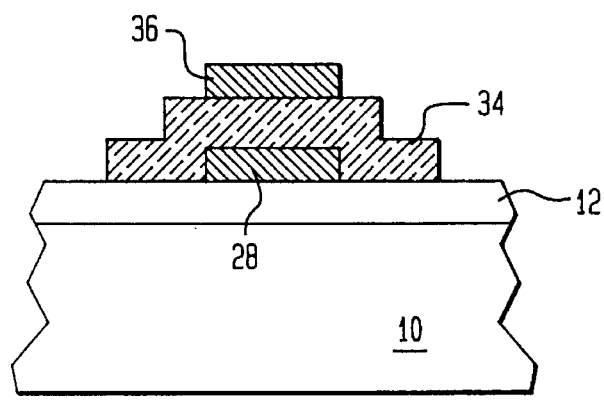

Last, by standard fabrication techniques, the other conductive electrode 36 of the noted capacitor is formed, as represented in FIG. 7. Illustratively, the electrode 36 also comprises a conventional three-layer metallization structure comprising Ti, Pt and Au. The overall thickness of the electrode 36 is, for example, about one-to-two μm.

Thus, in accordance with the invention, and as described in specific illustrative detail above, a thin conformal passivating dielectric film is deposited by ECR-CVD on a very-high-frequency HEMT device that includes an irregularly shaped sub-micron-size gate electrode. Moreover, even when additional relatively thick dielectric layers are subsequently deposited by ECR-CVD on the IC chip that includes such a device, the thin passivating film is effectively protected by an overlying resist layer and thereby kept from being thickened during additional deposition steps. Later, the resist layer can be removed in a lift-off step.

A wide range of conditions suitable for depositing silicon nitride layers on a planar substrate in an ECR-CVD step is described in "Kinetics and Compositional Dependence on the Microwave Power and $SiH_4/N_2$ Flow Ratio of Silicon Nitride Deposited by Electron Cyclotron Resonance Plasmas" by M. J. Hernandez et al, *J. Electrochem. Soc.*, Vol. 141, No. 11, November 1994, pages 3234–3237. But there is no suggestion therein of the inventive discovery that a thin conformal passivating dielectric film of silicon nitride can be deposited on the entirety of the surface of an irregularly shaped sub-micron-width gate electrode in an ECR-CVD process at a temperature sufficiently low (room temperature-to-about 100 degrees Celsius) to permit the use of conventional resist material to protect the film from subsequent deposition of dielectric by the ECR-CVD process, which resist material can be later removed in a lift-off step.

Finally, it is to be understood that the above-described arrangements and techniques are only illustrative of the principles of the present invention. In accordance with these principles, numerous modifications and alternatives may be devised by those skilled in the art without departing from the spirit and scope of the invention. Thus, for example, although primary emphasis herein has been directed to fabrication of an HEMT device, it is to be understood that the inventive principles are applicable in general to forming a very thin conformal dielectric film on any irregularly shaped sub-micron-size elements of a semiconductor device.

What is claimed is:

1. A method of fabricating an IC chip that comprises a semiconductor device that includes a sub-micron-size element, said method comprising the steps of depositing a conformal dielectric film by ECR-CVD to cover the entirety of the surface of said element, forming patterned resist over said dielectric film, depositing additional dielectric material by ECR-CVD, at a temperature below the glass transition temperature of said resist, on the entire surface of said device including the surface of the patterned resist, and lifting off said patterned resist and thereby removing the additional dielectric material on the surface of said resist, wherein said device element comprises the gate electrode of an HEMT device.

2. A method as in claim 1 wherein said gate electrode includes a stem portion and a bulbous portion, said stem portion having a width in the range of about 0.1-to-one μm.

3. A method as in claim 2 wherein said dielectric film comprises $SiN_x$, where x has a value in the range of about 1.2-to-1.4.

4. A method as in claim 3 wherein the additional dielectric material that remains on the surface of the device after said lift-off step comprises capacitor dielectric.

5. A method for fabricating an IC chip that includes multiple devices thereon, each of said devices including a gate electrode having a sub-micron-width stem portion, said method comprising the steps of depositing a conformal dielectric passivating film by ECR-CVD on the entire surface of said gate electrode, forming a protective layer comprising patterned resist overlying each of said gate electrodes, depositing additional dielectric material on the entire surface of said chip by ECR-CVD at a temperature below the glass transition temperature of said resist, and then, in a lift-off step, removing from said chip the patterned resist together with the additional dielectric material overlying said resist.

* * * * *